United States Patent
Wu et al.

(10) Patent No.: US 12,127,482 B2
(45) Date of Patent: Oct. 22, 2024

(54) MULTI-STATE SOT-MRAM STRUCTURE

(71) Applicant: INTERNATIONAL BUSINESS MACHINES CORPORATION, Armonk, NY (US)

(72) Inventors: Heng Wu, Guilderland, NY (US); Alexander Reznicek, Troy, NY (US); Bahman Hekmatshoartabari, White Plains, NY (US); Jingyun Zhang, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 285 days.

(21) Appl. No.: 17/247,365

(22) Filed: Dec. 9, 2020

(65) Prior Publication Data
US 2022/0181544 A1 Jun. 9, 2022

(51) Int. Cl.
| | | |
|---|---|---|
| H10N 50/10 | (2023.01) | |
| G11C 11/16 | (2006.01) | |
| H10B 61/00 | (2023.01) | |
| H10N 50/85 | (2023.01) | |
| H10N 52/80 | (2023.01) | |

(52) U.S. Cl.
CPC ........ *H10N 50/10* (2023.02); *G11C 11/161* (2013.01); *H10B 61/00* (2023.02); *H10N 50/85* (2023.02); *H10N 52/80* (2023.02)

(58) Field of Classification Search
CPC ........ H01N 50/10; H10B 61/00; H10N 52/80; H10N 50/85; G11C 11/161
See application file for complete search history.

(56) References Cited

U.S. PATENT DOCUMENTS

| | | | |
|---|---|---|---|
| 8,802,451 B2 * | 8/2014 | Malmhall | G11C 11/161 257/295 |
| 9,105,830 B2 | 8/2015 | Khvalkovskiy | |
| 9,337,413 B2 | 5/2016 | Ranjan | |
| 9,768,229 B2 | 9/2017 | Braganca | |

(Continued)

FOREIGN PATENT DOCUMENTS

WO 2019005172 A1 1/2019

OTHER PUBLICATIONS

Chang, et al., "PRESCOTT: Preset-based cross-point architecture for spin-orbit-torque magnetic random access memory," 2017 IEEE/ACM International Conference on Computer-Aided Design (ICCAD), Dec. 14, 2017 [accessed on Oct. 26, 2020], pp. 245-252, IEEE, Irvine, CA, USA, DOI: 10.1109/ICCAD.2017.8203785, Retrieved from the Internet: <URL: https://ieeexplore.ieee.org/document/8203785>.

(Continued)

*Primary Examiner* — Jay C Kim
*Assistant Examiner* — Woo K Lee
(74) *Attorney, Agent, or Firm* — Samuel A. Waldbaum

(57) ABSTRACT

A spin-orbit torque (SOT)-MRAM comprising a first magnetic tunneling junction (MTJ) having a first distance and having a first critical voltage. A second MTJ having a second distance and having a second critical voltage, wherein the first distance and the second distance are different, wherein the first critical voltage and the second critical voltages are (Continued)

different. A metal rail in direct contact with the first MTJ and the second MTJ, wherein the metal rail injects a spin current in to both the first MTJ and the second MTJ.

19 Claims, 10 Drawing Sheets

(56) References Cited

U.S. PATENT DOCUMENTS

| | | | |
|---|---|---|---|
| 9,830,966 B2 | 11/2017 | Mihajlovic | |
| 10,381,060 B2 | 8/2019 | Kan | |
| 10,481,815 B2* | 11/2019 | Torng | G06N 3/063 |
| 10,756,259 B2* | 8/2020 | Ahn | H10N 50/01 |
| 2009/0218645 A1 | 9/2009 | Ranjan | |
| 2017/0365777 A1 | 12/2017 | Mihajlovic | |
| 2019/0131977 A1 | 5/2019 | Obradovic | |
| 2019/0386203 A1 | 12/2019 | Gosavi | |
| 2020/0058339 A1 | 2/2020 | Hong | |
| 2020/0082885 A1* | 3/2020 | Lin | H01L 23/5226 |
| 2020/0235289 A1* | 7/2020 | Alam | H10B 61/00 |

OTHER PUBLICATIONS

U.S. Appl. No. 16/269,346, entitled "Hybrid Floating Point Representation for Deep Learning Acceleration", filed Feb. 6, 2019, 50 Pages.

Wang, et al., "Training Deep Neural Networks with 8-bit Floating Point Numbers," 32nd Conference on Neural Information Processing Systems (NeurIPS 2018), Dec. 19, 2018, 11 pages, arXiv: arXiv:1812.08011, Montréal, CA, Retrieved from the Internet: <URL: https://arxiv.org/abs/1812.08011>.

Kim et al., "Multilevel Spin-Orbit Torque MRAMs", IEEE Transactions on Electron Devices, vol. 62, No. 2, Feb. 2015, pp. 561-568.

Notification of Transmittal of the International Search Report and the Written Opinion of the International Searching Authority or the Declaration, Date of Mailing Feb. 23, 2022, International application No. PCT/EP2021/081157, 12 pages.

Shreya et al., "Modeling of Voltage-Controlled Spin-Orbit Torque MRAM for Multilevel Switching Application", IEEE Transactions on Electron Devices, vol. 67 No. 1, Jan. 2020, pp. 90-98.

* cited by examiner

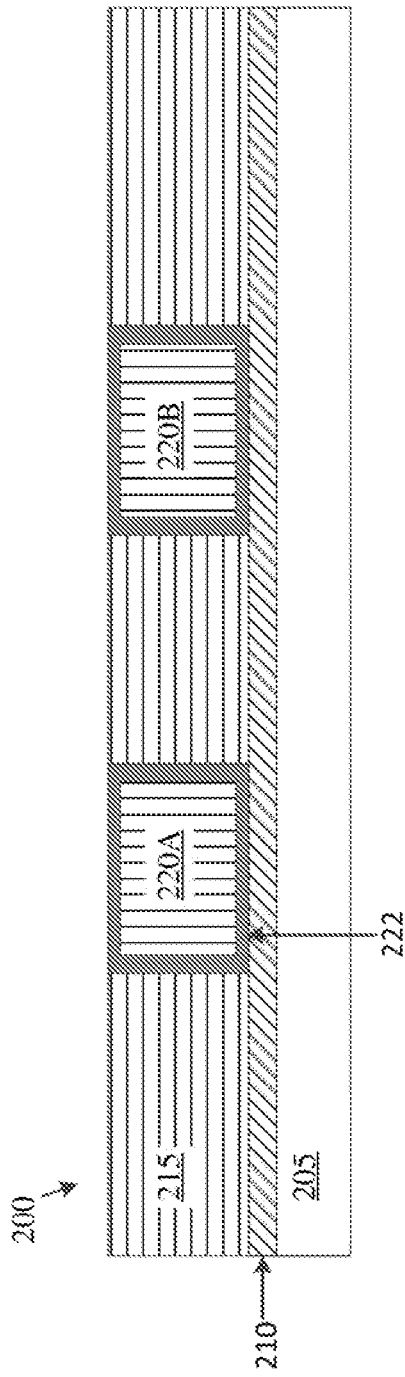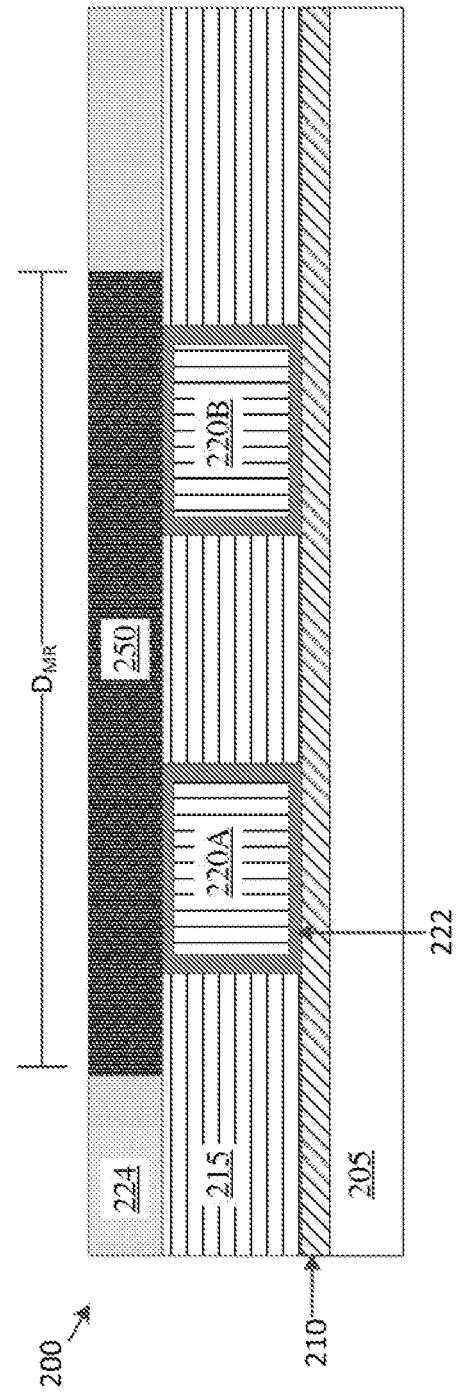

MULTI-STATE SOT-MRAM STRUCTURE

BACKGROUND

The present invention relates generally to the field of SOT-MRAM array, and more particularly to controlling the spin hall effect inside the heavy metal power rail contacting free layer of two adjacent magnetic tunnel junctions.

Multiplication operations (including convolution and matrix multiplication) are the most area and power consuming issues in hardware implementation of deep neural networks. Recent advances in reduced precision optimization suggest that at least a portion of multiplication operations may be performed at lower precision (i.e. with a fewer number of bits) without compromising the end-to-end accuracy. This provides opportunity for power and/or area saving by employing analog devices such as magnetic random-access memory (MRAM) for weight storage. However, the binary program state of MRAM (i.e. 0 with parallel spin or +1 with anti-parallel spin) is typically not sufficient for preserving accuracy and to meet to requirement for in-memory computation in cognitive applications. Spin-orbit torque magnetic random-access memory (SOT-MRAM) has emerged as a faster and higher reliability alternative to conventional MRAM, but the issues outlined above also apply to SOT-MRAM.

BRIEF SUMMARY

Additional aspects and/or advantages will be set forth in part in the description which follows and, in part, will be apparent from the description, or may be learned by practice of the invention.

A spin-orbit torque (SOT)-MRAM comprising a first magnetic tunneling junction (MTJ) having a first diameter distance and having a first critical voltage. A second MTJ having a second distance and having a second critical voltage, wherein the first distance and the second diameter distance are different, wherein the first critical voltage and the second critical voltages are different. A metal rail in direct contact with the first MTJ and the second MTJ, wherein the metal rail injects a spin current in to both the first MTJ and the second MTJ.

In accordance with an aspect of the present invention, wherein the first distance is greater than the second distance and the first critical voltage is greater than the second critical voltage.

In accordance with an aspect of the present invention, wherein the metal rail is in direct contact with the free layer of the first MTJ and the free layer of the second MTJ.

In accordance with an aspect of the present invention, wherein when the metal rail applies a voltage to the first MTJ and the second MTJ, the injected spin current changes the spin of the free layer of the first MTJ and/or the second MTJ.

In accordance with an aspect of the present invention, wherein the first diameter is greater than the second diameter and the first critical voltage is greater than the second critical voltage.

In accordance with an aspect of the present invention, wherein when the metal rail applies a voltage to the first MTJ and the second MTJ, wherein the injected spin current is equal to the second critical voltage.

In accordance with an aspect of the present invention, wherein the injected spin current changes the spin of the free layer of the second MTJ but does not affect the spin of the free layer of the first MTJ.

In accordance with an aspect of the present invention, wherein when the metal rail applies a voltage to the first MTJ and the second MTJ, wherein the injected spin current is equal to the first critical voltage.

In accordance with an aspect of the present invention, wherein the injected spin current changes the spin of the free layer of the second MTJ and changes the spin of the free layer of the first MTJ.

In accordance with an aspect of the present invention, wherein the reference layer has a thickness in a range of about 10 to 30 nm.

In accordance with an aspect of the present invention, wherein the tunnel barrier has a thickness in a range of about 1 to 5 nm.

In accordance with an aspect of the present invention, wherein the free layer has a thickness in a range of about 10 to 30 nm.

In accordance with an aspect of the present invention, wherein the metal rail has a thickness in a range of about 5 to 30 nm.

A spin-orbit torque (SOT)-MRAM comprising a metal layer that includes a first electrode and a second electrode and a first magnetic tunneling junction (MTJ) located on the first electrode, wherein the first MTJ has a first distance and has a first critical voltage. A second MTJ located on the second electrode, wherein the second MTJ has a second distance and has a second critical voltage, wherein the first distance and the second distance are different, wherein the first critical voltage and the second critical voltages are different. A metal rail located on the first MTJ and the second MTJ, wherein the metal rail injects a spin current in to both the first MTJ and the second MTJ.

In accordance with an aspect of the present invention, wherein the first MTJ and the second MTJ are each comprised of a reference layer, a tunnel barrier, and a free layer.

In accordance with an aspect of the present invention, wherein the metal rail is in direct contact with the free layer of the first MTJ and the free layer of the second MTJ.

In accordance with an aspect of the present invention, wherein when the metal rail injects the spin current in to the first MTJ and the second MTJ, the applied voltage changes the spin of the free layer of the first MTJ and/or the second MTJ.

In accordance with an aspect of the present invention, wherein the first distance is greater than the second distance and the first critical voltage is greater than the second critical voltage.

In accordance with an aspect of the present invention, wherein when injecting the spin current equal to the second critical voltage, then the spin of the free layer of the second MTJ changes, wherein injecting the spin current equal to the first critical voltage, then the spin of the free layer of the second MTJ changes and the spin of the free layer of the first MTJ changes.

A spin-orbit torque (SOT)-MRAM comprising a metal layer that includes a first electrode and a second electrode. A metal rail located directly on the first electrode and on the second electrode. A first magnetic tunneling junction (MTJ) located on the metal rail, wherein the first MTJ has a first distance and has a first critical voltage. A second MTJ located on the metal rail, wherein the second MTJ has a second distance and has a second critical voltage, wherein the first distance and the second distance are different, wherein the first critical voltage and the second critical voltages are different, wherein the metal rail can inject a spin current to both the first MTJ and the second MTJ.

A method comprising forming a first layer on a first electrode and a second electrode. Forming a second layer on the first layer and forming a third layer on the second layer. Etching the first layer, the second layer, and the third layer to form a first magnetic tunneling junction (MTJ) and to form a second MTJ. The first MTJ is located on the first electrode and the second MTJ is located on the second electrode. The first MTJ has a first distance and has a first critical voltage and wherein the second MTJ has a second distance and has a second critical voltage. The first distance and the second distance are different and wherein the first critical voltage and the second critical voltages are different. Forming a capping layer on the exposed surfaces of the first MTJ and the second MTJ and forming a dielectric layer on the capping layer. Etching a trench in the dielectric layer and the capping layer to expose the third layer of the first MTJ and the third layer of the second MTJ. The distance of the trench is greater than or equal to the distance between the farthest edge of the capping layer on the first MTJ to the farthest edge on the second MTJ. Forming a metal rail in in the trench, wherein the metal rail is in direct contact with the first MTJ and the second MTJ, wherein the metal rail injects a spin current in to both the first MTJ and the second MTJ.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 6 illustrates a formation of the bottom electrodes in the cross section of the SOT-MRAM, in accordance with an embodiment of the present invention.

FIG. 7 illustrates the formation of the spin hall effect metal rail across the bottom electrodes in the cross section of the SOT-MRAM, in accordance with an embodiment of the present invention.

DETAILED DESCRIPTION

Figure 1:
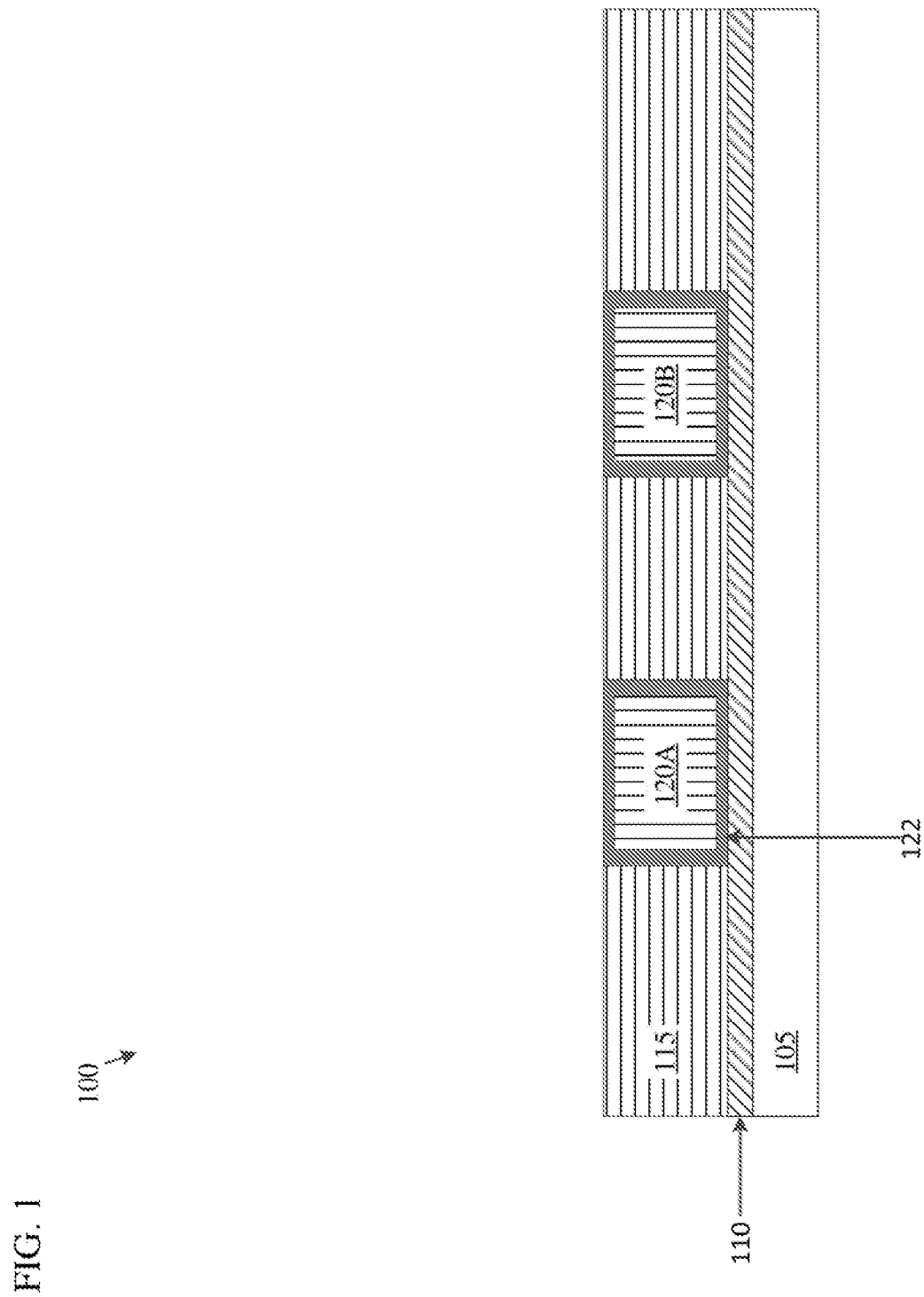
FIG. 1 illustrates a formation of the bottom electrodes in the cross section of the SOT-MRAM, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e. two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g. aluminum, copper, etc.) and insulators (e.g. various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. Embodiments of the present invention are generally directed to a SOT-MRAM. Magneto resistive random-access memory (MRAM) is becoming more and more attractive in industry because of its promising prospects for replacing or extending various well-developed memory technologies. It can fulfill not only the speed requirements of cache memory and dynamic random-access memory (DRAM) with additional nonvolatility but also the capacity demand of hard-disk drive (HDD) and solid-state drive (SSD). So far, much effort has been devoted to spin-transfer torque-based MRAM (STT-MRAM) in which the write and read operations share the same current path flowing through the tunnel barrier of magnetic tunnel junction (MTJ) which serves as the bit storage and readout element. Presently, this physical limit still leads to considerable write error rates, access time above ~10 ns, aging of tunnel barriers, and suboptimal power consumption in MRAM. Spin-orbit torque-based MRAM (SOT-MRAM) can have significantly improved performance on these metrics by using decoupled read and write paths or by using novel materials with giant SOT effect.

The present invention comprises at least two magnetic tunnel junctions (MTJs) in the SOT-MRAM, where the distances of each of the at least two MTJs are different. Different diameters, widths or distances in the at least two MTJs means that the critical voltage for each of the MTJs are different. The difference in critical voltages (or critical current density) between the at least two MTJs needs to be large enough that the MTJ with the lower critical voltage/current density can have a spin current applied to it without affecting the adjacent MTJ. The Spin hall effect metal rail has a charge current conducting inside it, which simultaneously injects spin current to the free layer of the at least two MTJs. The injected spin current affects the spin of the free layer in the MTJ, wherein the spin of the free layer is changed based on the injected spin current and the critical voltage of the MTJ. Magnetization switching by spin-orbit torque (SOT) via spin Hall effect represents as a competitive alternative to that by spin-transfer torque (STT) used for magneto resistive random access memory (MRAM), as SOT does not require high-density current to go through the tunnel junction for the switching and the path for write/read of the MTJ are separated. Due to the size difference in the two MTJ, the critical current for MTJ switch is different for each of the MTJs. A shared spin hall effect (SHE) metal line is utilized to apply a spin current injection to the at least two MTJs. The injected spin current is used for switching the spin polarization of the free layer. Considering this, the current density used in SHE line needed for the two MTJ will be different, causing different switching requirements for the different sized MTJs. By utilizing this, multiple state of SOT-MTJ can be realized. The SHE metal rail is usually composed of heavy metals such as Ta, Pt or W, due to the spin hall effect, with a charge current flowing inside the SHE metal rail, a spin current transporting in vertical direction is generated and inject polarized electron spin to both the first MTJ and the second MTJ. Due to the torque introduced by the injected spin, the free layers of the two MTJ can be flipped.

The spin hall effect consists of the appearance of spin accumulation on the lateral surfaces of an electric current-carrying sample, the signs of the spin directions being opposite on the opposing boundaries. In a cylindrical wire, the current-induced surface spins will wind around the wire. When the current direction is reversed, the directions of spin orientation is also reversed. The spin Hall effect is a transport phenomenon consisting of the appearance of spin accumulation on the lateral surfaces of a sample carrying electric current. The opposing surface boundaries will have spins of opposite sign. It is analogous to the classical Hall effect, where charges of opposite sign appear on the opposing lateral surfaces in an electric-current carrying sample in a magnetic field. In the case of the classical Hall effect the charge builds up at the boundaries is in compensation for the Lorentz force acting on the charge carriers in the sample due to the magnetic field. No magnetic field is needed for the spin Hall effect which is a purely spin-based phenomenon. The spin Hall effect belongs to the same family as the anomalous Hall effect, known for a long time in ferromagnets, which also originates from spin-orbit interaction.

FIG. 1 illustrates a formation of the bottom electrodes in the cross section of the SOT-MRAM 100, in accordance with an embodiment of the present invention.

A first underlying layer 105 and a second underlying layer 110 form the base of the SOT-MRAM 100, where the first underlying layer 105 and the second underlying layer 110 include vias, transistors, wiring, and other electrical components. A metal layer is formed on the second underlying layer 110, where the metal layer includes at least a dielectric layer 115, a first electrode 120A, and a second electrode 120B. The first electrode 120A and the second electrode 120B are coated with a protective layer 122. The first electrode 120A and the second electrode 120B can be the same size or different sizes.

Figure 2:
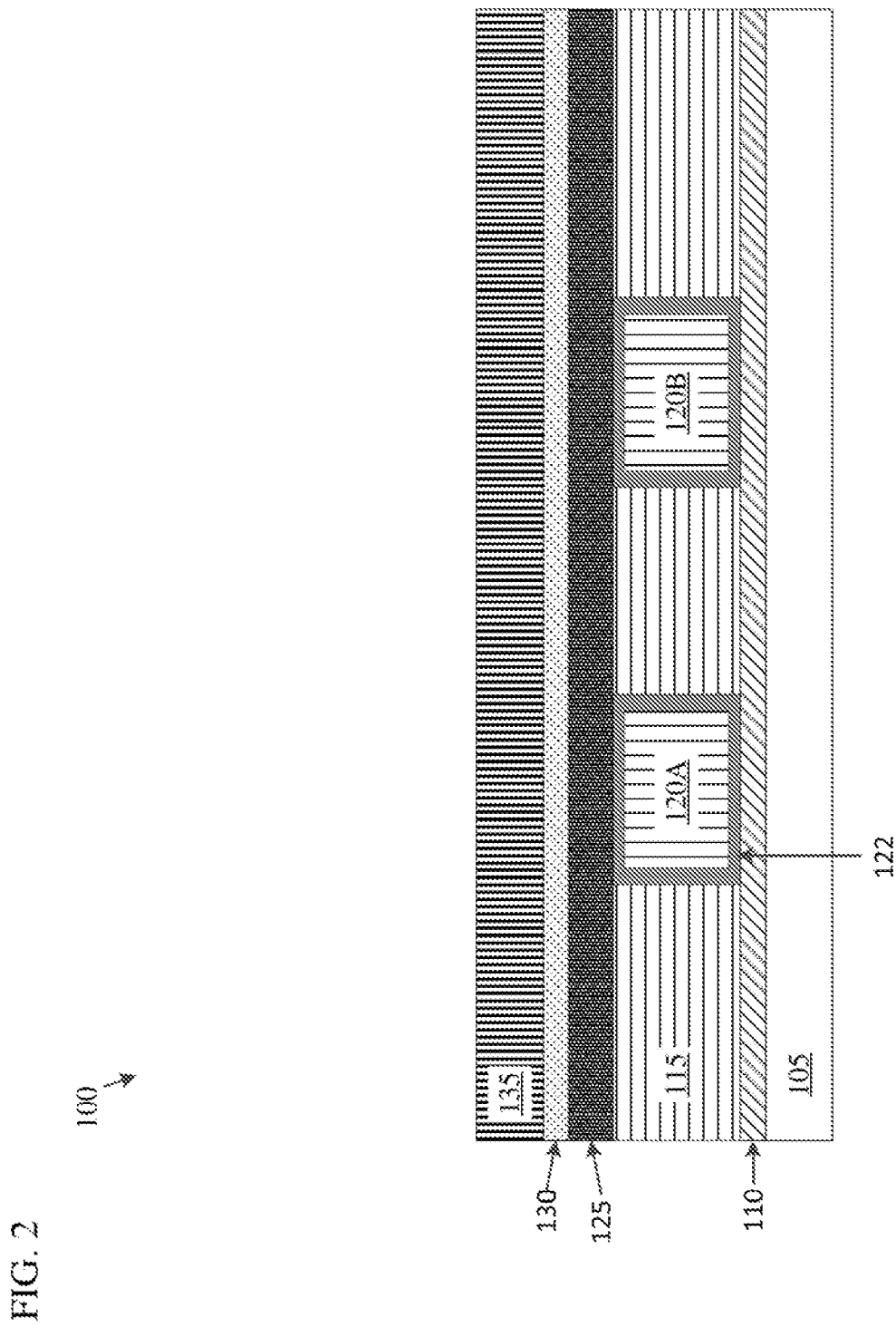
FIG. 2 illustrates the formation of the layers that comprise the MTJ in the cross section of the SOT-MRAM, in accordance with an embodiment of the present invention.

FIG. 2 illustrates the formation of the layers that comprise the MTJ in the cross section of the SOT-MRAM 100, in accordance with an embodiment of the present invention. The magnetic tunneling junction (MTJ) is formed on top of the dielectric layer 115, the first electrode 120A, and the second electrode 120B. The MTJ includes a reference layer 125, a tunnel barrier layer 130, and a free layer 135. The reference layer 125 has a thickness in a range of about 10 to 30 nm. The material for the reference layer 125 can be selected from a group that includes CoFeB layers with Fe Co, PT, or Ta. The tunnel barrier 130 has a thickness in a range of about 1 to 5 nm. The tunnel barrier layer 130 can be selected from a group that includes MgO or $Al_2O_3$. The free layer 135 has a thickness in a range of about 10 to 30 nm. The free layer 135 can be selected from a group that includes CoFeB multi-layers with Mo, Pt, or Ta.

Figure 3:
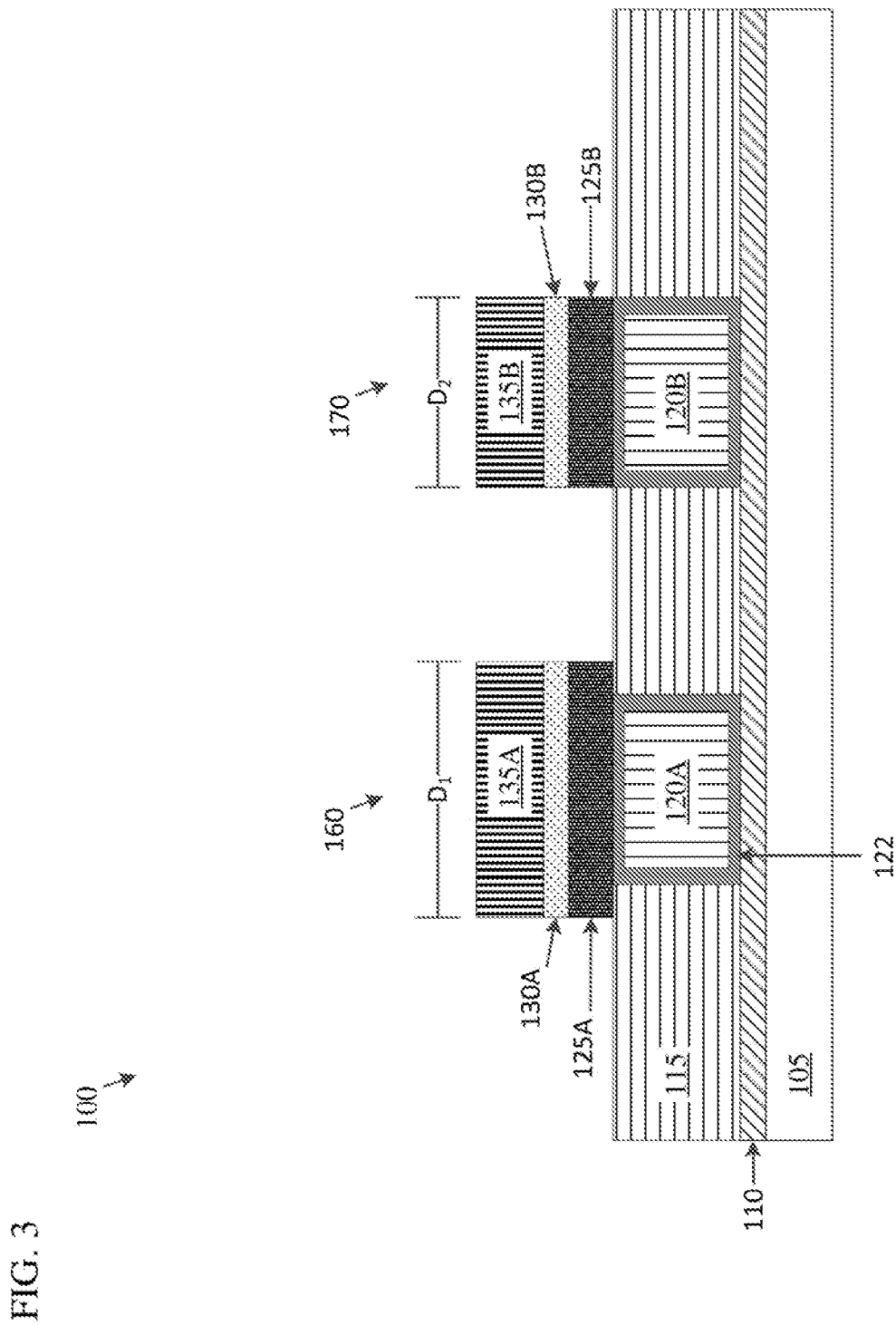
FIG. 3 illustrates MTJs of different sizes in the cross section of the SOT-MRAM, in accordance with an embodiment of the present invention.

FIG. 3 illustrates MTJs of different sizes in the cross section of the SOT-MRAM 100, in accordance with an embodiment of the present invention. The layers (125, 130 and 135) are etched to form at least two MTJs. The first MTJ 160 includes a first reference layer 125A, a first tunnel barrier 130A, and a first free layer 130A. The first MTJ 160 has a distance $D_1$. The second MTJ 170 includes a second reference layer 125B, a second tunnel barrier 130B, and a second free layer 130B. The second MTJ 170 has a distance $D_2$. The sizes of the first MTJ 160 and the second MTJ 170 are different, where $D_1$ is greater than $D_2$. MTJs of different sizes cause the critical voltage for the first MTJ 160 and the second MTJ 170 to be different. The difference in the sizes of the MTJs must be large enough to have a separation in the critical voltages for each of the MTJs.

Figure 4:
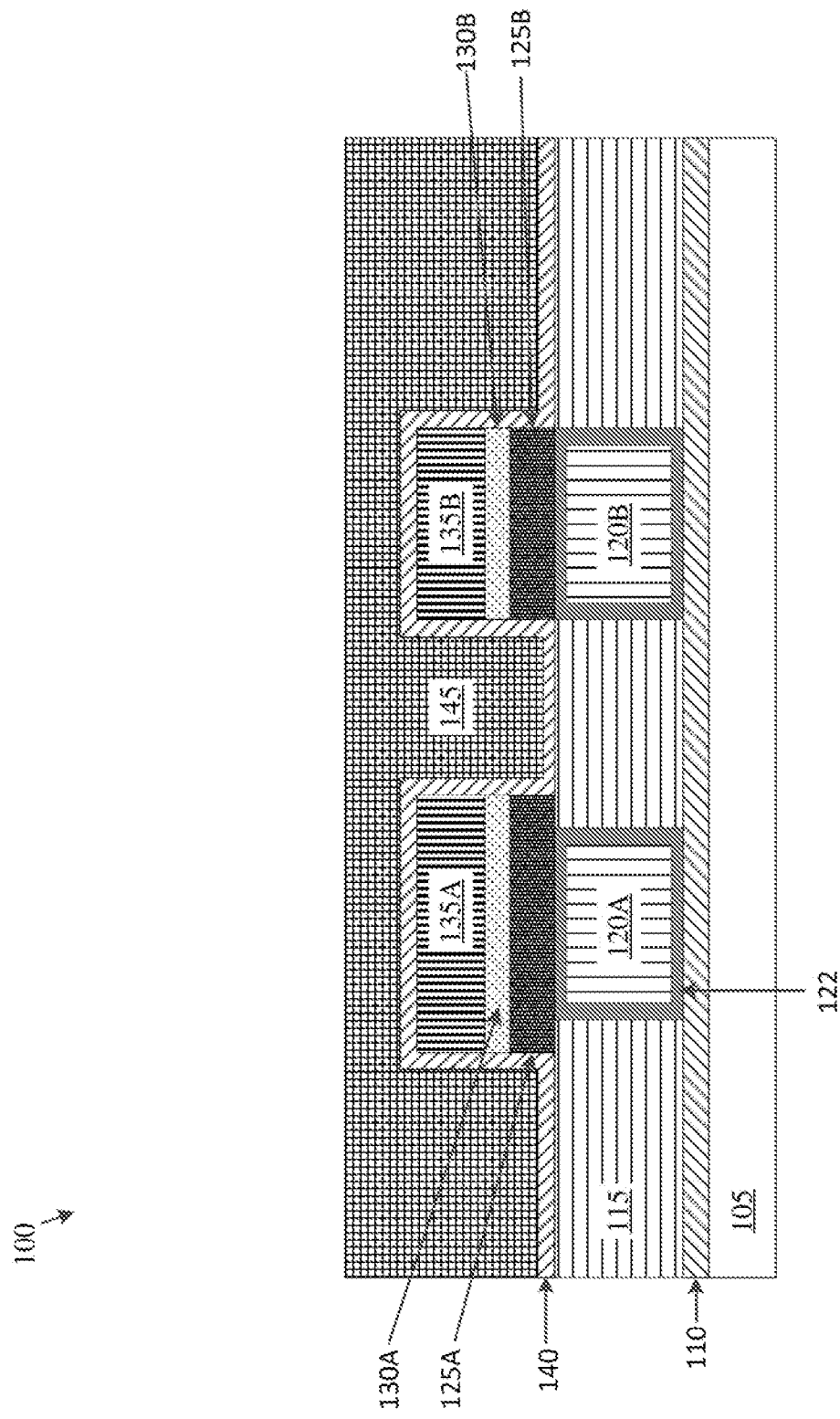
FIG. 4 illustrates the formation of a capping layer and a second dielectric layer in the cross section of the SOT-MRAM, in accordance with an embodiment of the present invention.

FIG. 4 illustrates the formation of a capping layer 140 and a second dielectric layer 145 in the cross section of the SOT-MRAM 100, in accordance with an embodiment of the present invention. A capping layer 140 is formed on the exposed surfaces of the dielectric layer 115 and the exposed surfaces of the at least two MTJs 160 and 170. The material for the capping layer 140 can be selected from a group that includes SiN, SiCN, or SiBCN. The capping layer 140 has a thickness in the range of about 10 to 40 nm. A second dielectric layer 145 is formed on the capping layer 140. The second dielectric layer 145 can be selected from a group that includes low-k dielectrics, $SiO_2$, or SiCO.

Figure 5:
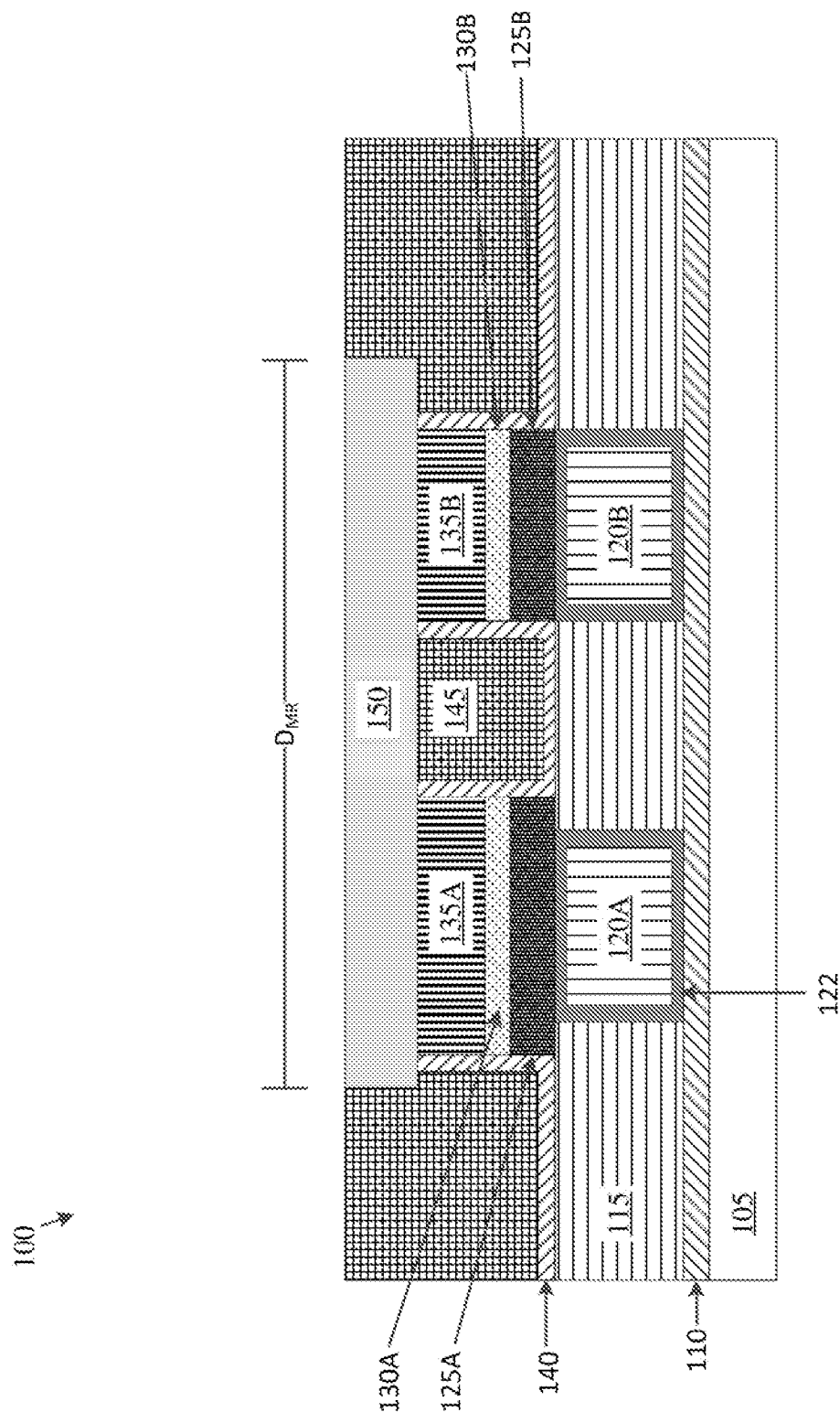
FIG. 5 illustrates the formation of the spin hall effect metal rail across the free layer of the MTJ in the cross section of the SOT-MRAM, in accordance with an embodiment of the present invention.

FIG. 5 illustrates the formation of the spin hall effect (SHE) metal rail 150 across the free layer of the MTJ in the cross section of the SOT-MRAM 100, in accordance with an embodiment of the present invention. The second dielectric layer 145 is etched to from a trench that spans the distance $D_{MR}$. Where $D_{MR}$ is greater than or equal to the distance between the farthest edge of the capping layer 140 on the first MTJ 160 to the farthest edge on the second MTJ 170. The capping layer 140 located on top of the MTJs 160 and 170 is removed to expose the underlying free layers 135A and 135B. A SHE metal rail 150 is formed in the trench, where the SHE metal rail 150 extends the length $D_{MR}$. The SHE metal rail 150 has a thickness in a range of about 5 to 30 nm. The material for the SHE metal rail 150 can be selected from a group that includes Pt, Pd, W, or Ta. The switch critical current for each of the MTJs 160 and 170 are different, due to the distance differences between the first MTJ 160 and the second MTJ 170. The shared SHE metal rail 150 is used to inject spin current in to the MTJ free layer 135A, 135B for spin polarization switching. Considering this, the current used in SHE metal rail 150 needed to switch each of the two MTJs 160 and 170 will be different. By utilizing this, multiple states of SOT-MTJ can be realized. For example, if the critical voltage for the first MTJ 160 is 0.5 v and the critical voltage for the second MTJ 170 is 0.3 v. The second MTJ 170 voltage is smaller because the distance of the second MTJ 170 is smaller than the distance of the first MTJ 160. There are three possible states achievable by this design, for example, a first state is no voltage, or a low voltage (lower than lowest critical voltages of MTJs) is applied. A second state is achievable by having the SHE metal rail 150 apply a spin current to first and second MTJs 160 and 170 equal to the lower critical voltage of the second MTJ 170. This causes the spin of the second free layer 130B to switch. A third state is achievable by having the SHE metal rail 150 inject a spin current to first and second MTJs 160 and 170 equal to the high voltage of the first MTJ 170. This causes the spin of the first free layer 130A and the spin of the second free layer 130B to switch. The number of states can be increase by increasing the number of MTJs, but the sizing of each of the MTJs must be different enough so that the critical voltages of the MTJs are different.

FIG. 6 illustrates a formation of the bottom electrodes in the cross section of the SOT-MRAM 200, in accordance with an embodiment of the present invention. An underlying layer 205 and a second underlying layer 210 form the base of the SOT-MRAM 200, where the underlying layer 205 and the second underlying layer 210 include vias, transistors, wiring, and other electrical components. A metal layer is formed on the second underlying layer 210, where the metal layer includes at least a dielectric layer 215, a first electrode 220A, and a second electrode 220B. The first electrode 220A and the second electrode 220B are coated with a protective layer 222. The first electrode 220A and the second electrode 220B can be the same size or different sizes.

FIG. 7 illustrates the formation of the spin hall effect metal rail 250 across the bottom electrodes in the cross section of the SOT-MRAM 200, in accordance with an embodiment of the present invention. A second dielectric layer 224 is formed on top of the first dielectric layer 215 and on top of the first electrode 220A and the second electrode 220B. The second dielectric layer 215 can be selected from a group that includes low-k dielectrics, $SiO_2$, or SiCO. The second dielectric layer 224 is etched to form a trench that has a length $D_{MR}$ that is greater than or equal to the distance between the farthest edge of the first electrode 220A to the farther edge of the second electrode 220B. The trench is filled with a SHE metal rail 250. The SHE metal rail 250 has a thickness in a range of about 5 to 30 nm. The material for the SHE metal rail 250 can be selected from a group that includes Pt, Pd, W, or Ta.

Figure 8:
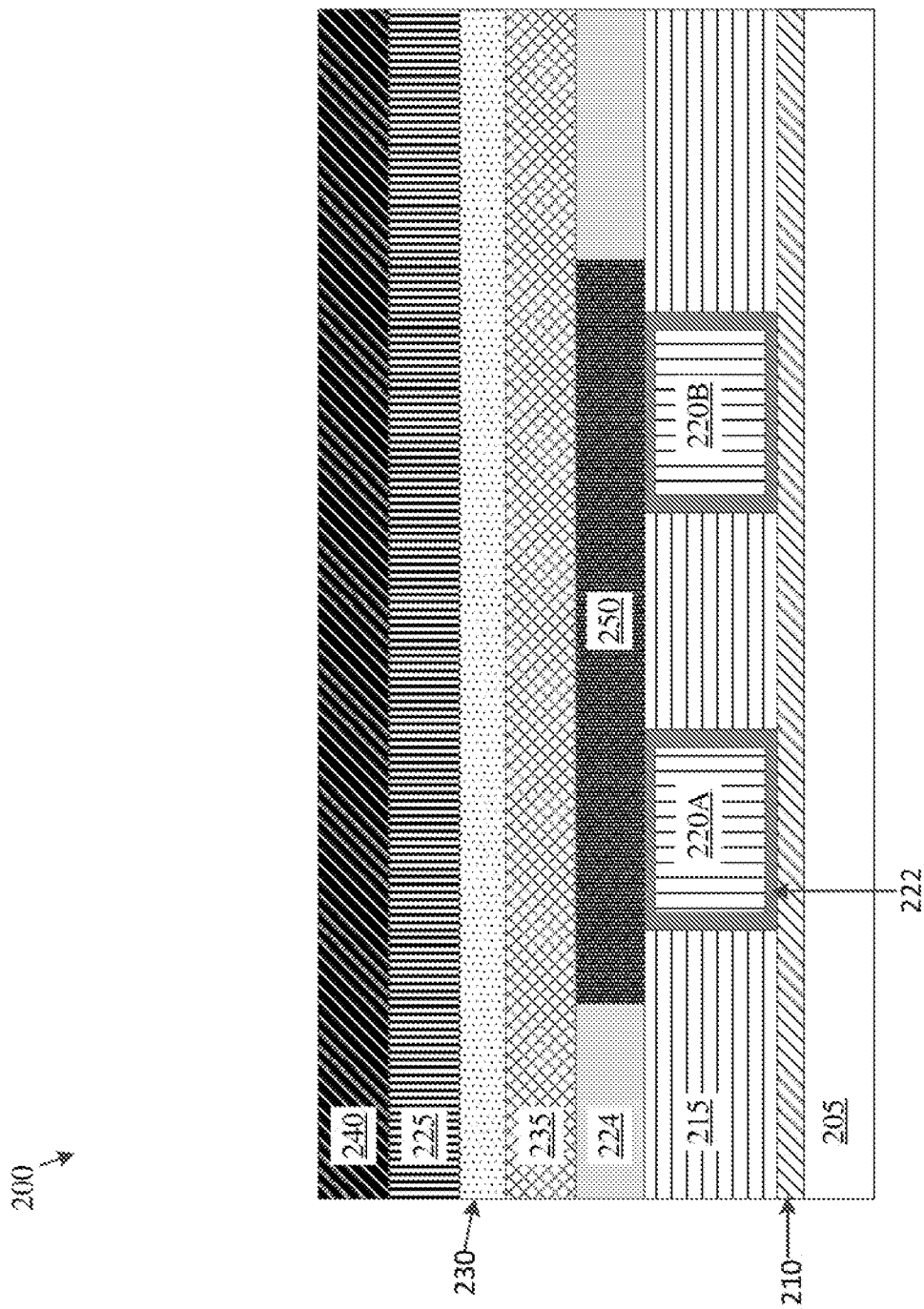
FIG. 8 illustrates the formation of the layers that comprise the MTJ in the cross section of the SOT-MRAM, in accordance with an embodiment of the present invention.

FIG. 8 illustrates formation of the layers that comprise the MTJ in the cross section of the SOT-MRAM 200, in accordance with an embodiment of the present invention. The magnetic tunneling junction (MTJ) is formed on top of the second dielectric layer 224 and the SHE metal rail 250. The MTJ includes a reference layer 225, a tunnel barrier layer 230 and a free layer 235. A metal layer 240 is formed on top of the reference layer 225. The reference layer 225 has a thickness in a range of about 10 to 30 nm. The material for the reference layer 225 can be selected from a group that includes CoFeB layers with Fe Co, PT, or Ta. The tunnel barrier 230 has a thickness in a range of about 1 to 5 nm. The tunnel barrier layer 230 can be selected from a group that includes MgO or $Al_2O_3$. The free layer 235 has a thickness in a range of about 10 to 30 nm. The free layer 235 can be selected from a group that includes CoFeB multi-layers with Mo, Pt, or Ta. The layer order in FIG. 8 for the MTJ is reversed from the order illustrated in FIG. 2, to allow the free layer 235 to be formed directly on top of the SHE metal rail.

Figure 9:
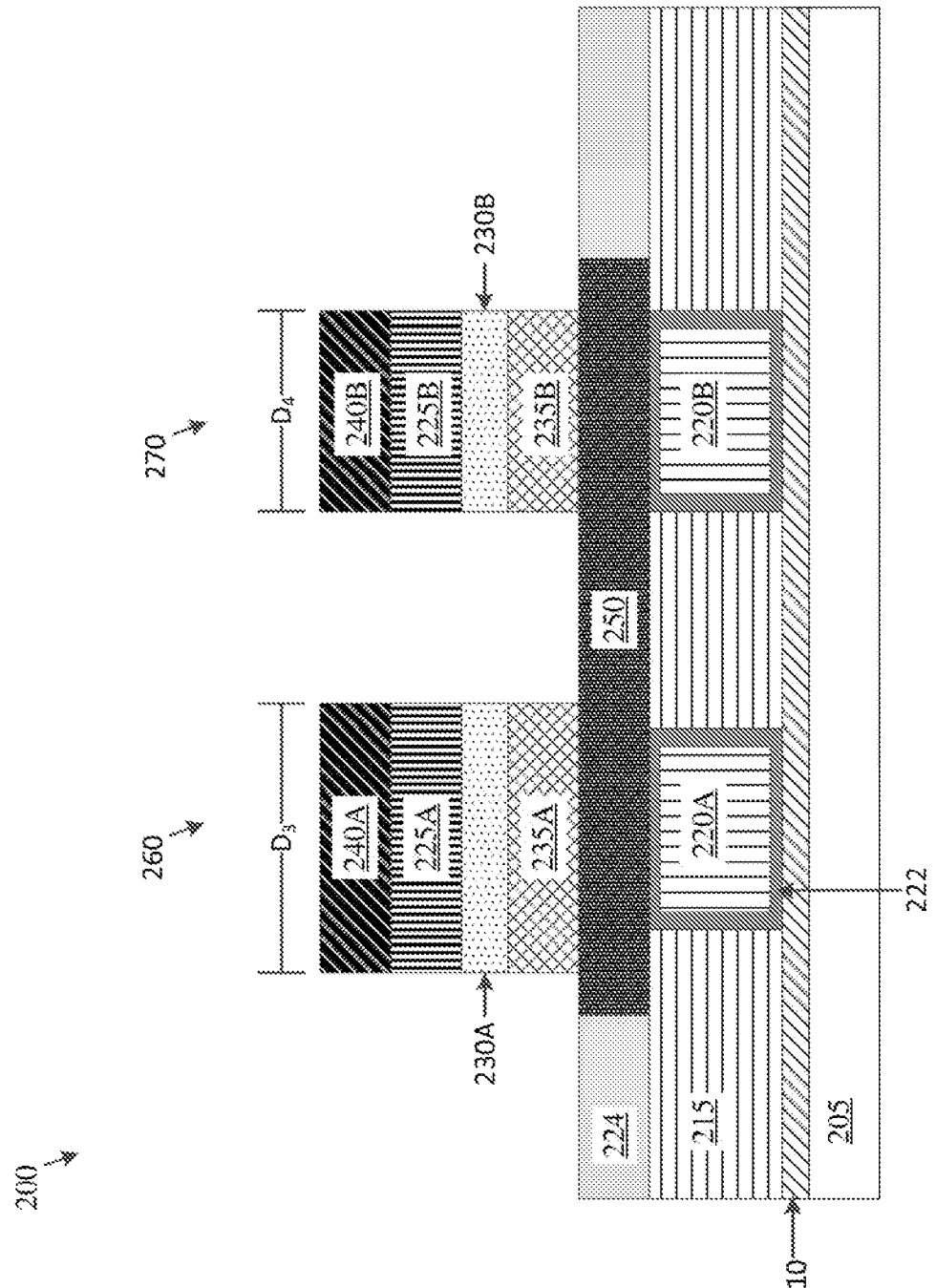
FIG. 9 illustrates MTJs of different sizes in the cross section of the SOT-MRAM, in accordance with an embodiment of the present invention.

FIG. 9 illustrates MTJs of different sizes in the cross section of the SOT-MRAM 200, in accordance with an embodiment of the present invention. The layers (225, 230, 235 and 240) are etched to form at least two MTJs. The first MTJ 260 includes a first reference layer 225A, a first tunnel barrier 230A, a first free layer 230A, and a first metal layer 240A. The first MTJ 260 has a distance $D_3$. The second MTJ 270 includes a second reference layer 225B, a second tunnel barrier 230B, a second free layer 230B, and a second metal layer 240B. The second MTJ 270 has a distance $D_4$. The sizes of the first MTJ 260 and the second MTJ 270 are different, where $D_3$ is greater than $D_4$. MTJs of different sizes cause the critical voltage for the first MTJ 260 and the second MTJ 270 to be different. The difference in the sizes of the MTJs must be large enough to have a separation in the critical voltages for each of the MTJs.

Figure 10:
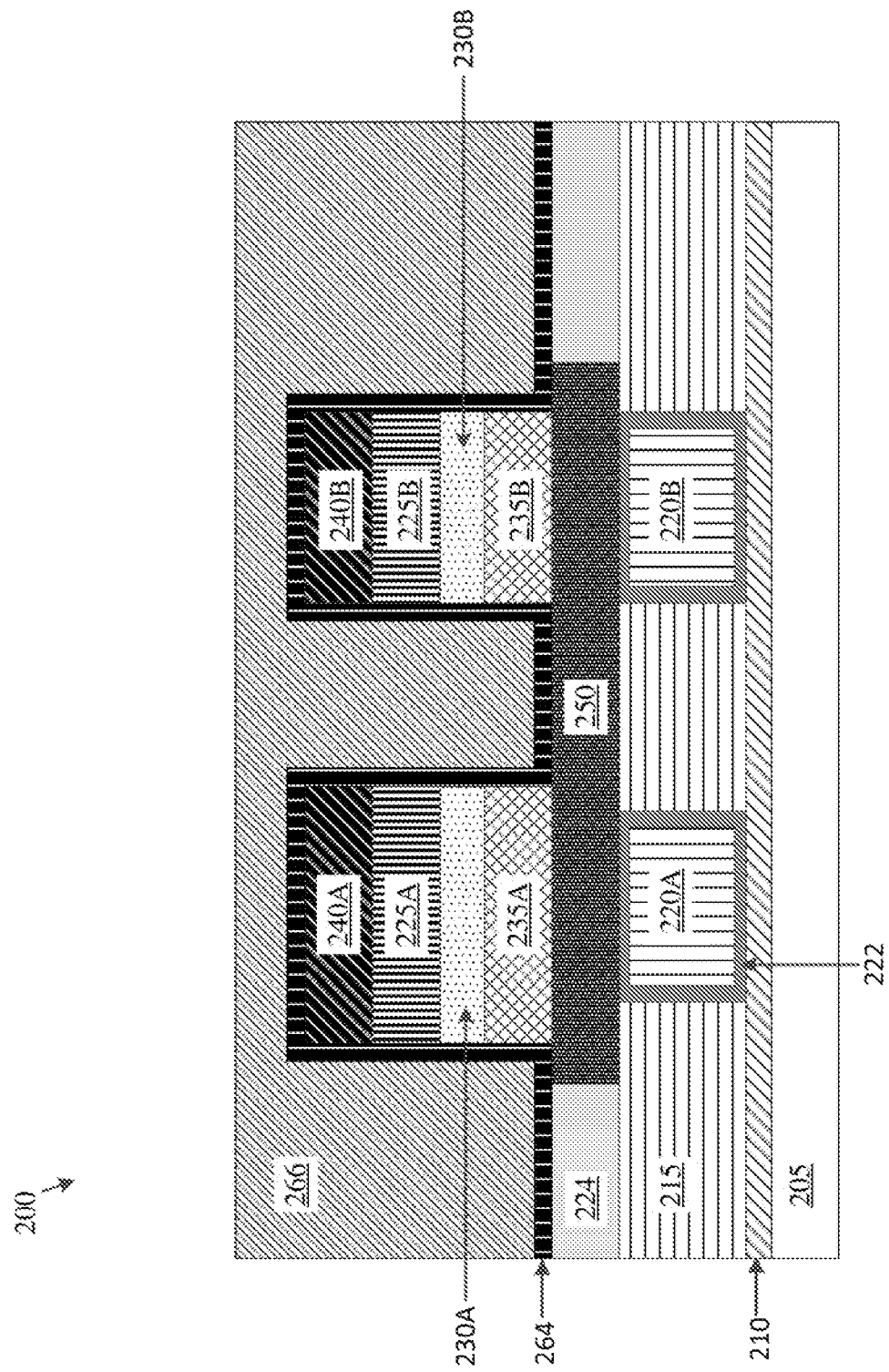
FIG. 10 illustrates formation capping layer and a dielectric layer in the cross section of the SOT-MRAM, in accordance with an embodiment of the present invention.

FIG. 10 illustrates the formation a capping layer 264 and a third dielectric layer 266 in the cross section of the SOT-MRAM 200, in accordance with an embodiment of the present invention. A capping layer 264 is formed on the exposed surfaces of the second dielectric layer 224 and the exposed surfaces of the at least two MTJs 260, 270. The material for the capping layer 264 can be selected from a group that includes SiN, SiCN, or SiBCN. The capping layer 264 has a thickness in the range of about 10 to 40 nm. A third dielectric layer 266 is formed on the capping layer 264. The third dielectric layer 266 can be selected from a group that includes low-k dielectrics, $SiO_2$, or SiCO.

Figure 11:
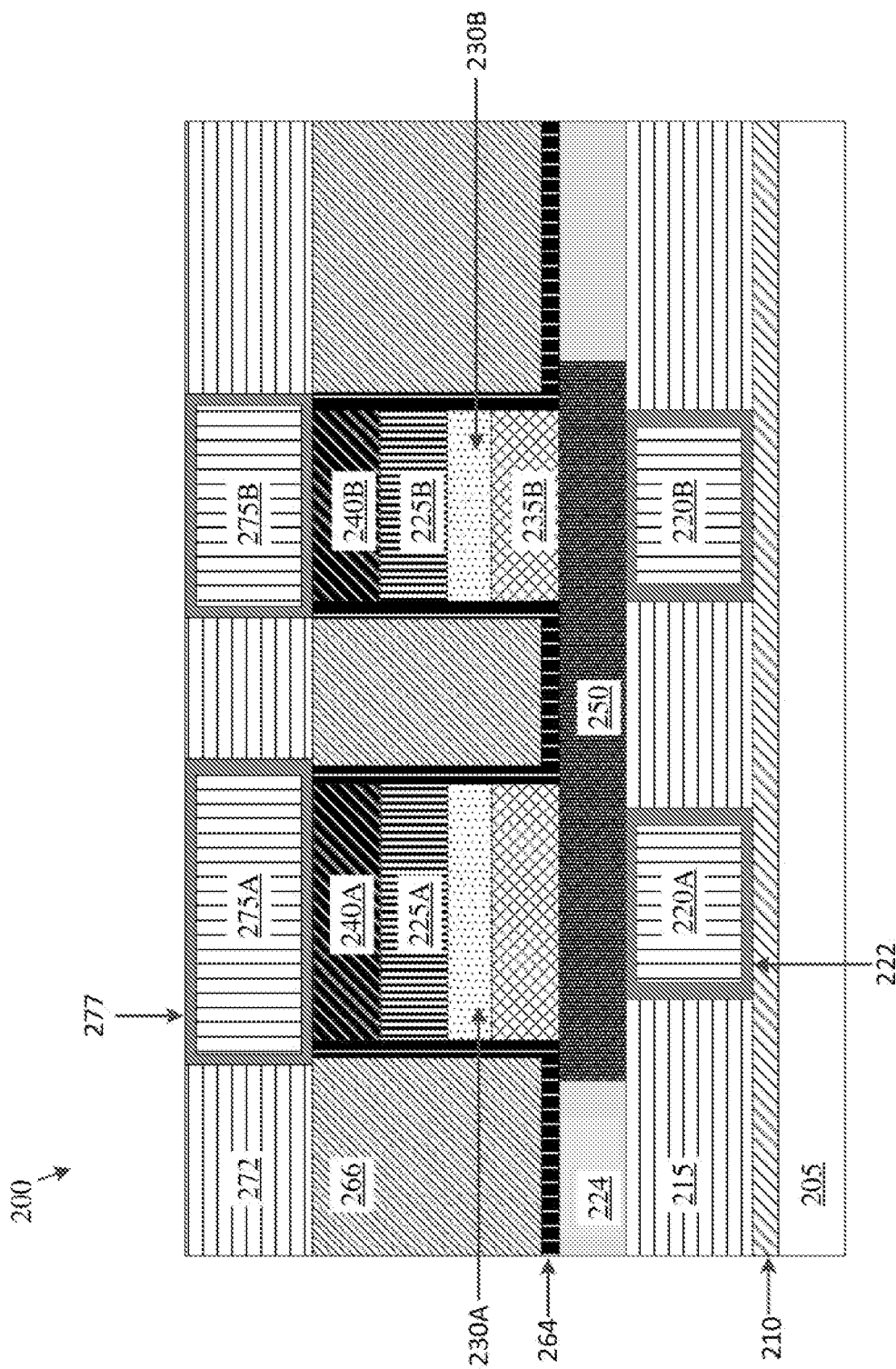
FIG. 11 illustrates a formation of the top electrodes in the cross section of the SOT-MRAM, in accordance with an embodiment of the present invention.

FIG. 11 illustrates a formation of the top electrodes in the cross section of the SOT-MRAM 200, in accordance with an embodiment of the present invention. The third dielectric layer 266 and the capping layer 164 are planarized to expose the top surface of the metal layer 240A and 240B. A third metal layer is formed on the top surface of the third dielectric layer 266 and on the exposed surface of metal layer 240A and 240B. The third metal layer includes at least a fourth dielectric layer 272, a first upper electrode 275A, and a second upper electrode 275B. The first upper electrode 275A and the second upper electrode 275B are coated with a productive layer 277. The first upper electrode 275A and the second upper electrode 275B can be the same size or different sizes.

The switch critical current for each of the MTJs 260 and 270 are different, due to the distance differences between the first MTJ 260 and the second MTJ 270. The shared SHE metal rail 250 is used to inject spin current to the MTJ free layer 235A, 235B for spin polarization switching. Considering this, the current used in SHE metal rail 250 needed to switch each of the two MTJs 260 and 270 will be different. By utilizing this, multiple states of SOT-MTJ can be realized. For example, if the critical voltage for the first MTJ 260 is 0.5 v and the critical voltage for the second MTJ 270 is 0.3 v. The second MTJ 270 voltage is smaller because the distance of the second MTJ 270 is smaller than the distance of the first MTJ 260. There are three possible states achievable by this design, for example, first state is no voltage, or a low voltage (lower than lowest critical voltages of MTJs) is applied. A second state is achievable by having the SHE metal rail 250 apply a spin current to first and second MTJs 260 and 270 equal to the lower critical voltage of the second MTJ 270. This causes the spin of the second free layer 230B to switch. A third state is achievable by having the SHE metal rail 250 inject a spin current in to first and second MTJs 260 and 270 equal to the high voltage of the first MTJ 270. This causes the spin of the first free layer 230A and the spin of the second free layer 230B to switch. The number of states can be increase by increasing the number of MTJs, but the sizing of each of the MTJs must be different enough so that the critical voltages of the MTJs are different.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A spin-orbit torque (SOT)-magnetic random access memory (MRAM) comprising:
   a first magnetic tunneling junction (MTJ) having a first lateral dimension and having a first current density;
   a second MTJ having a second lateral dimension and having a second current density, wherein the first lateral dimension and the second lateral dimension are different, wherein the first current density and the second current density are different;
   a capping layer located on at least one vertical side of the first MTJ and at least one vertical side of the second MTJ; and
   a metal rail in direct contact with the first MTJ and the second MTJ, wherein the metal rail injects a spin current in to both the first MTJ and the second MTJ, wherein the metal rail is in direct contact with a top surface of the capping layer, wherein a horizontal bottom surface of the metal rail is in direct contact with the first MTJ, the second MTJ, and the top surface of the capping layer.

2. The SOT-MRAM of claim 1, wherein the first MTJ and the second MTJ are each comprised of a reference layer, a tunnel barrier, and a free layer.

3. The SOT-MRAM of claim 2, wherein the metal rail is in direct contact with the free layer of the first MTJ and the free layer of the second MTJ.

4. The SOT-MRAM of claim 3, wherein when the metal rail applies a voltage to the first MTJ and the second MTJ, the injected spin current changes the spin of the free layer of the first MTJ and/or the second MTJ.

5. The SOT-MRAM of claim 3, wherein the first lateral dimension is greater than the second lateral dimension and the first current density is greater than the second current density.

6. The SOT-MRAM of claim 5, wherein when the metal rail applies a voltage to the first MTJ and the second MTJ, wherein the injected spin current is equal to the second current density.

7. The SOT-MRAM of claim 6, wherein the injected spin current changes the spin of the free layer of the second MTJ but does not affect the spin of the free layer of the first MTJ.

8. The SOT-MRAM of claim 5, wherein when the metal rail applies a voltage to the first MTJ and the second MTJ, wherein the injected spin current is equal to the first current density.

9. The SOT-MRAM of claim 8, wherein the injected spin current changes the spin of the free layer of the second MTJ and changes the spin of the free layer of the first MTJ.

10. The SOT-MRAM of claim 2, wherein the reference layer has a thickness in a range of about 10 to 30 nm.

11. The SOT-MRAM of claim 2, wherein the tunnel barrier has a thickness in a range of about 1 to 5 nm.

12. The SOT-MRAM of claim 2, wherein the free layer has a thickness in a range of about 10 to 30 nm.

13. The SOT-MRAM of claim 1, wherein the metal rail has a thickness in a range of about 5 to 30 nm.

14. A spin-orbit torque (SOT)-magnetic random access memory (MRAM) comprising:
    a metal layer that includes a first electrode and a second electrode;
    a first magnetic tunneling junction (MTJ) located on the first electrode, wherein the first MTJ has a first lateral dimension and has a first current density;
    a second MTJ located on the second electrode, wherein the second MTJ has a second lateral dimension and has a second current density, wherein the first lateral dimension and the second lateral dimension are different, wherein the first current density and the second current density are different;
    a capping layer located on at least one vertical side of the first MTJ and at least one vertical side of the second MTJ; and
    a metal rail located on the first MTJ and the second MTJ, wherein the metal rail injects a spin current in to both the first MTJ and the second MTJ, wherein the metal rail is in direct contact with a top surface of the capping layer, wherein a horizontal bottom surface of the metal rail is in direct contact with the first MTJ, the second MTJ, and the top surface of the capping layer.

15. The SOT-MRAM of claim 14, wherein the first MTJ and the second MTJ are each comprised of a reference layer, a tunnel barrier, and a free layer.

16. The SOT-MRAM of claim 15, wherein the metal rail is in direct contact with the free layer of the first MTJ and the free layer of the second MTJ.

17. The SOT-MRAM of claim 16, wherein when the metal rail injects the spin current in to the first MTJ and the second MTJ, the applied voltage changes the spin of the free layer of the first MTJ and/or the second MTJ.

18. The SOT-MRAM of claim 16, wherein the first lateral dimension is greater than the second lateral dimension and the first current density is greater than the second current density.

19. The SOT-MRAM of claim 18, wherein when injecting the spin current equal to the second current density, then the spin of the free layer of the second MTJ changes, wherein injecting the spin current equal to the first current density, then the spin of the free layer of the second MTJ changes and the spin of the free layer of the first MTJ changes.

* * * * *